(12) United States Patent
Lai et al.

(10) Patent No.: US 11,227,851 B2
(45) Date of Patent: Jan. 18, 2022

(54) CONTROL DEVICE AND CIRCUIT BOARD

(71) Applicant: REALTEK SEMICONDUCTOR CORP., Hsinchu (TW)

(72) Inventors: Chao-Min Lai, Hsinchu (TW);
Ping-Chia Wang, Hsinchu (TW);
Han-Chieh Hsieh, Hsinchu (TW);
Tang-Hung Chang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 8 days.

(21) Appl. No.: 16/718,256

(22) Filed: Dec. 18, 2019

(65) Prior Publication Data
US 2020/0211994 A1   Jul. 2, 2020

(30) Foreign Application Priority Data

Jan. 2, 2019   (TW) .................................. 108100064

(51) Int. Cl.
*H01L 23/48*   (2006.01)
*H01L 23/00*   (2006.01)
*H01L 23/498*   (2006.01)

(52) U.S. Cl.
CPC ........ *H01L 24/14* (2013.01); *H01L 23/49822* (2013.01); *H01L 23/49838* (2013.01); *H01L 2224/14177* (2013.01)

(58) Field of Classification Search
CPC .............. H01L 24/14; H01L 23/49822; H01L 23/49838; H01L 2224/14177;
(Continued)

(56) References Cited

U.S. PATENT DOCUMENTS

| 6,992,374 B1* | 1/2006 | Yang ................... H05K 1/0231 257/678 |
| 10,194,530 B2* | 1/2019 | Chang ............... H01L 23/49816 |

(Continued)

FOREIGN PATENT DOCUMENTS

| CN | 201467560 U | 5/2010 |
| EP | 2808890 A1 | 12/2014 |

(Continued)

OTHER PUBLICATIONS

European Patent Office, Patent Search Report dated May 29, 2020.
Keven Coates, "TI via Channel Array", Texas Instruments.

*Primary Examiner* — Nicholas J Tobergte
(74) *Attorney, Agent, or Firm* — Li & Cai Intellectual Property (USA) Office

(57) ABSTRACT

A control device and a circuit board are provided. The control device can cooperate with the circuit board, and includes a ball grid array. The ball grid array includes a plurality of power balls and a plurality of ground balls, which are jointly arranged in a ball region. The power balls and the ground balls are respectively divided into a plurality of power ball groups and a plurality of ground ball groups. One of the ground ball groups includes two ground balls and is adjacent to a power ball group. A ball pitch between the two ground balls is greater than that between one of the power balls and one of the ground balls adjacent to each other. The circuit board includes a contact pad array corresponding to the ball grid array of the control device so that the control device can be disposed on the circuit board.

7 Claims, 7 Drawing Sheets

(58) Field of Classification Search
CPC .......... H05K 2201/09409; H05K 2201/10734; H05K 2201/093; H05K 3/3436
See application file for complete search history.

(56) References Cited

U.S. PATENT DOCUMENTS

| | | |
|---|---|---|
| 2003/0102159 A1 | 6/2003 | Loo |
| 2005/0162839 A1* | 7/2005 | Chan .................... H05K 1/0231 361/782 |
| 2005/0184390 A1* | 8/2005 | Gagne .................... H01L 24/49 257/738 |
| 2010/0237492 A1 | 9/2010 | Funaya et al. |
| 2016/0190084 A1* | 6/2016 | Plasterer ................ H01L 24/17 257/48 |
| 2020/0395290 A1* | 12/2020 | Kim ..................... H01L 23/528 |

FOREIGN PATENT DOCUMENTS

| | | |
|---|---|---|
| EP | 3021647 A1 | 5/2016 |
| TW | 201618615 A | 5/2016 |
| TW | I677065 B | 11/2019 |

* cited by examiner

CONTROL DEVICE AND CIRCUIT BOARD

CROSS-REFERENCE TO RELATED PATENT APPLICATION

This application claims the benefit of priority to Taiwan Patent Application No. 108100064, filed on Jan. 2, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a control device and a circuit board, and more particularly to a control device having a ball grid array and a circuit board for operation with the control device.

BACKGROUND OF THE DISCLOSURE

In a conventional packaged integrated circuit (IC) component which is packaged by a ball grid array package process, a solder ball array is formed at the bottom of the package substrate. The solder ball array includes a plurality of solder balls as external contacts so that a chip of the conventional packaged IC component can be electrically connected to a printed circuit board for signal transmission between the chip and the printed circuit board.

Currently, in the designs of the printed circuit board and the ball grid array, ground balls are electrically connected to a ground plane of the printed circuit board respectively through ground vias, and power balls are electrically connected to a power plane of the printed circuit board respectively through power vias. In order to reduce the voltage drop (or IR drop) resulting from the parasitic resistance of the printed circuit board, the numbers of the ground balls and the power balls would be increased as much as possible so as to increase the current paths. Accordingly, the numbers of the ground vias and the power vias are increased with the increasing numbers of the ground balls and the power balls, such that the arrangements of the ground vias and the power vias become denser. In addition, the conventional ground and power balls are respectively arranged in different regions to simplify the fabrication of wiring layers of the printed circuit board.

Furthermore, in order to further minimize the size of the packaged IC component, a pitch between any two adjacent solder balls has to be further shortened; for example, the pitch may be shortened from 0.65 mm to 0.5 mm. However, the space for arranging the ground vias and the power vias would be further reduced so as to be in cooperation with the smaller pitches. Accordingly, respective apertures of the ground and power vias has to be further reduced without decreasing respective quantities of the ground and power vias.

Although the ground vias and the power vias with smaller aperture can be fabricated by laser drilling, the fabrication cost is higher. Another solution is decreasing the respective quantities of the solder balls, ground vias, and power vias so as to minimize the size of the packaged IC component. However, decreasing the quantities of the solder balls, ground vias, and power vias may result in an increase in impedance.

SUMMARY OF THE DISCLOSURE

In response to the above-referenced technical inadequacies, the present disclosure provides a control device and a circuit board, in which the size of the control device can be reduced without significantly increasing the impedance and higher fabrication cost.

In one aspect, the present disclosure provides a control device including a ball grid array disposed at a bottom thereof. The ball grid array includes a plurality of ground balls and a plurality of power balls, which are jointly arranged in a ball region. The power balls are divided into a plurality of power ball groups, and the ground balls are divided into a plurality of ground ball groups. At least one of the ground ball groups includes two of the ground balls and is adjacent to at least one of the power ball groups. A ball pitch between the two ground balls of the at least one of the ground ball groups is greater than that between one of the power balls and one of the ground balls that are adjacent to each other.

In one aspect, the present disclosure provides a control device including a ball grid array disposed at a bottom thereof. The ball grid array includes a plurality of ground balls and a plurality of power balls, which are jointly arranged in a ball region. The power balls and the ground balls are arranged into a first column, a second column, and a third column, the second column is located between the first and third columns. A first column pitch between the first column and the second column is greater than a second column pitch between the second column and the third column.

In one aspect, the present disclosure provides a circuit board including a laminated board and a pad array. The laminated board has a first surface and a second surface opposite to the first surface. The laminated board includes a ground layer and a power layer which is insulated from the ground layer. The pad array is disposed on the first surface and includes a plurality of power pads which are electrically connected to the power layer, and a plurality of ground pads which are electrically connected to the ground layer. The power pads and the ground pads are jointly arranged in a first predetermined region of the first surface. The power pads are divided into a plurality of power pad groups, and the ground pads are divided into a plurality of ground pad groups. At least one of the ground pad groups includes two ground pads and is adjacent to one of the power pad groups, and a pad pitch between the two ground pads of the at least one of the ground pad groups is greater than a pad pitch between one of the power pad and one of the ground pad that are adjacent to each other.

Therefore, one of the advantages of the present disclosure is that in the control device and the circuit board provided in the present disclosure, by the technical features of "a ball pitch between the two ground balls of the at least one of the ground ball groups is greater than the ball pitch between the power ball and the ground ball which are adjacent to each other" or "the ground balls and the power balls are alternately arranged to form a first column, a second column, and a third column, all of which extend in a first direction, and a first column pitch between the first and second columns is greater than a second column pitch between the second and third columns," the size of the control device 1 can be further reduced without overly reducing the space for disposing the ground conductive vias and the power conductive vias in the circuit board.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
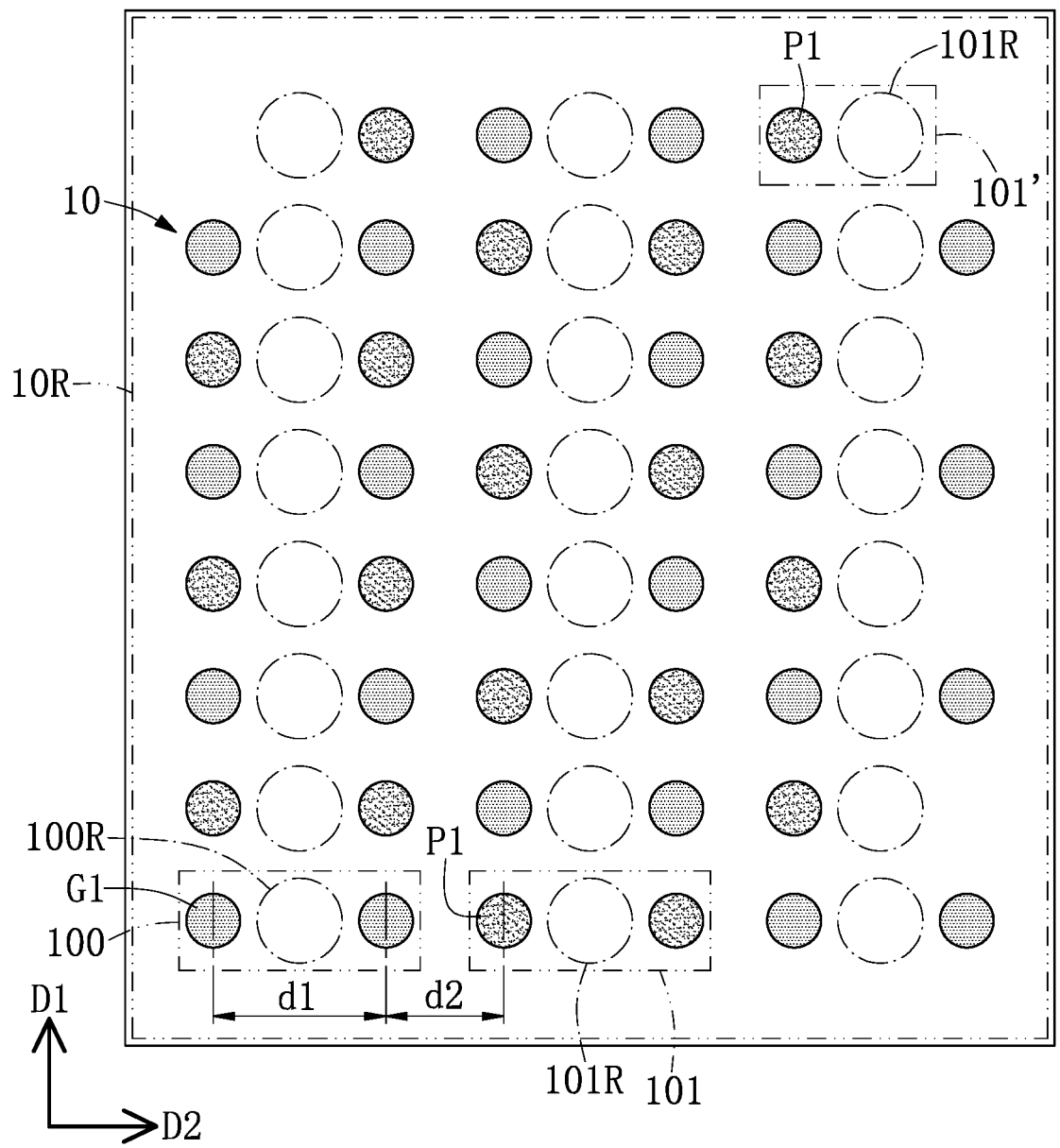
FIG. 1 is a partial view of the bottom of a control device according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a partial view of the bottom of a control device according to an embodiment of the present disclosure. The control device 1 can be assembled on a circuit board to form an electronic apparatus. Furthermore, the control device 1 can operate with the circuit board.

The control device 1 can be a central processing unit (CPU) or a graphic processing unit (GPU), which can be a package structure of a system on chip (SoC). Furthermore, the control device 1 can operate at a high frequency.

The control device 1 includes a ball grid array 10 disposed at a bottom thereof, and the ball grid array 10 includes a plurality of power balls P1 and a plurality of ground balls G1. It should be noted that in the embodiment of the present disclosure, the ball pitches between the balls (including the power balls P1 and the ground balls G1) are modified so that the size of the control device 1 can be further reduced.

It should be noted that, FIG. 1 is a schematic view of the ball grid array 10 with portions thereof being omitted in order to more clearly illustrate the concept of the present disclosure, rather than a view showing the ball grid array being used in practical application. In practice, the ball grid array 10 further includes signal balls, but the signal balls are not illustrated in FIG. 1 for convenience of explanation.

As shown in FIG. 1, the ground balls G1 and the power balls P1 of the ball grid array 10 are arranged in the same ball region 10R. The power balls P1 are divided into a plurality of power ball groups 101, and the ground balls G1 are divided into a plurality of ground ball groups 100.

Specifically, at least one of the ground ball groups 100 includes two ground balls G1 and is adjacent to one of the power ball groups 101. Furthermore, one of the power ball groups 101 includes two power balls P1. As shown in FIG. 1, in the instant embodiment, one of the power ball groups 101' can include only one power ball P1.

Reference is made to FIG. 1. In the instant embodiment, the power ball groups 101 and the ground ball groups 100 are arranged to form a column in an alternating manner. Specifically, one of the ground ball groups 100 is arranged between every two of the power ball groups 101. In one embodiment, the two power balls P1 of the power ball groups 101 and the two ground balls G1 are in alignment with one another along the first direction D1.

Furthermore, the power ball groups 101 and the ground ball groups 100 are arranged in a second direction D2 in an alternating manner. To be more specific, the two power balls P1 in one of the power ball groups 101 and the two ground balls G1 in the adjacent one of the ground ball groups 100 are in alignment with one another in the second direction D2.

It should be noted that in one of the ground ball groups 100, a ball pitch d1 between the two ground balls G1 is greater than a ball pitch d2 between the power ball P1 and the ground ball G1 that are adjacent to each other. Similarly, in one of the power ball groups 101, a ball pitch between the two power balls P1 is greater than the ball pitch d2 between the power ball P1 and the ground ball G1 that are adjacent to each other.

In the instant embodiment, the ball pitch between the two power balls P1 is the same as the ball pitch d1 between the two ground balls G1. Furthermore, the term of "ball pitch" or "pitch between two adjacent balls" means a linear distance between two respective geometric centers of two adjacent balls.

As a whole, in the embodiment shown in FIG. 1, the ground balls G1 and the power balls P1 are alternately arranged in a plurality of columns in the first direction D1.

The first column pitch (which is equal to the ball pitch d1) between a first column and a second column is greater than a second column pitch (which is equal to the ball pitch d2) between the second column and a third column.

Furthermore, the power balls P1 and the ground balls G1 are arranged in a plurality of rows in a second direction D2. A row pitch between any two adjacent rows is less than the first column pitch. In the instant embodiment, the row pitch between any two adjacent rows is substantially the same as the ball pitch d2.

In one embodiment, the ball pitch d1 between the two ground balls G1 of the ground ball group 100 or between the two power balls P1 of the power ball group 101 ranges from 0.65 mm to 0.75 mm. Furthermore, the ball pitch d2 between the power ball P1 and the ground ball G1 which are adjacent to each other ranges from 0.4 mm to 0.5 mm.

That is to say, rather than reducing all of the ball pitches, in the present disclosure, a portion of the ball pitches (such as the ball pitch d1) in one of the directions (the second direction D2) are relatively increased and another portion of the ball pitches (such as the ball pitch d2) are relatively reduced so that the size of the control device 1 can be reduced.

Furthermore, since the ball pitch d1 between the two ground balls G1 in any ground ball group 100 is greater, a first corresponding region 100R is defined between the two ground balls G1 so that a position of the ground conductive via on the circuit board 2 can be further defined. Similarly, a second corresponding region 101R can be defined between the two adjacent power balls P1 in any power ball group 101, so that a position of the power conductive via on the circuit board 2 can be defined.

In the instant embodiment, an imaginary connection line connecting two centers of the two ground balls G1 extends across the first corresponding region 100R, and an imaginary connection line that is connected between the two centers of the two power balls P1 extends across the first corresponding region 101R. Furthermore, in the instant embodiment, when the power ball group 101' includes only one power ball P1, the second corresponding region 101R is adjacent to the power ball P1 and located at a side of the power ball P1 which is farther away from the ground ball group 100.

Accordingly, by reducing a portion of the ball pitches, the size of the control device 1 can be minimized without excessively reducing the space for arranging the ground conductive vias or power conductive vias, thereby preventing the overall impedance from being lowered. It should be noted that as long as the power ball P1 and the ground ball G1 are not short-circuited when the control device 1 is disposed on the circuit board 2, the ball pitch d2 between the power ball P1 and the ground ball G1, which are adjacent to each other, is allowed to be further reduced. Accordingly, the present disclosure is not limited to the embodiment shown in FIG. 1.

Figure 2:
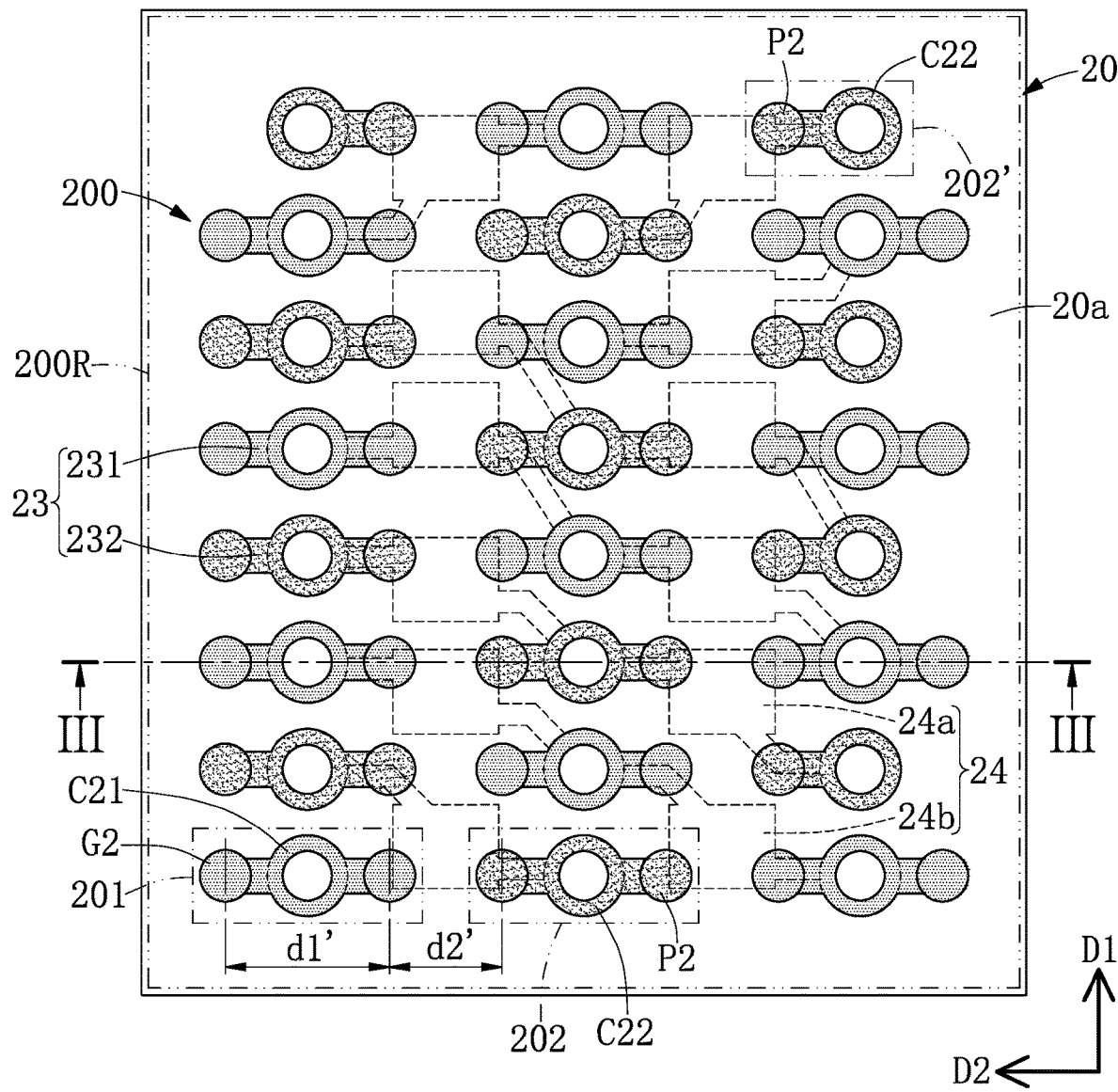
FIG. 2 is a partial top view of a circuit board according to an embodiment of the present disclosure.
Figure 3:
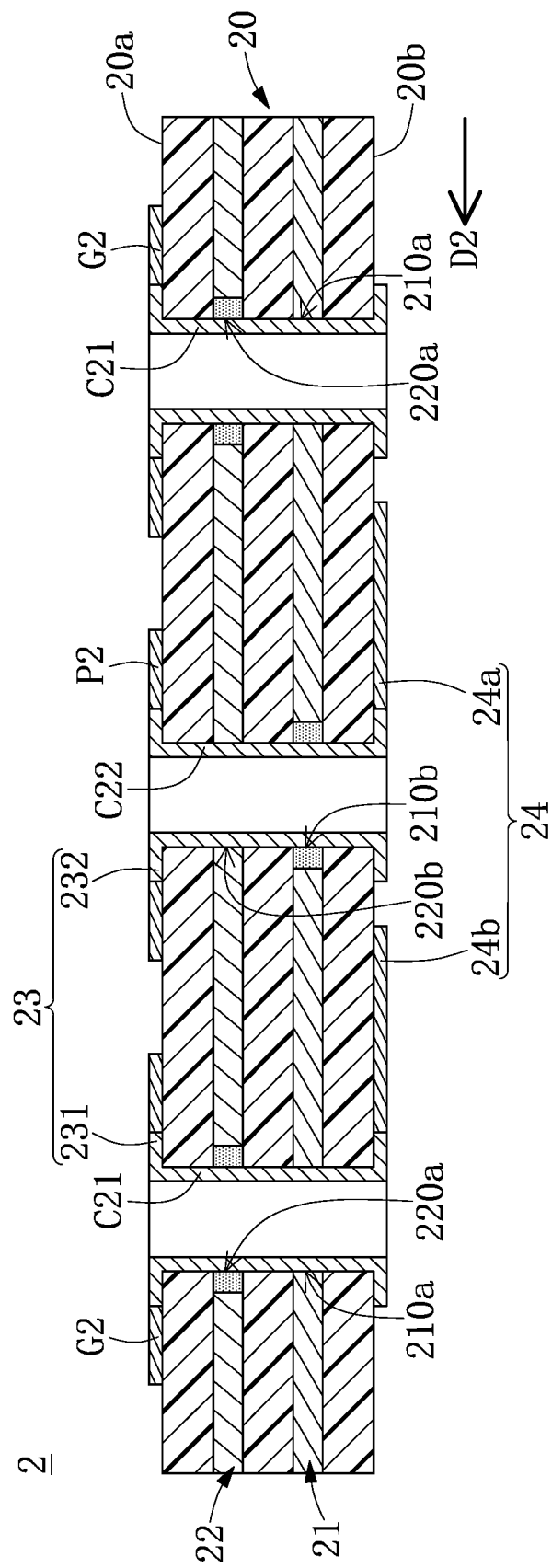
FIG. 3 is a partial cross-sectional view taken along line III-III of FIG. 2.

Reference is made to FIG. 2 and FIG. 3. FIG. 2 is a partial top view of a circuit board according to an embodiment of the present disclosure. FIG. 3 is a partial cross-sectional view taken along line III-III of FIG. 2. The circuit board 2 includes a laminated board 20 and a pad array 200 disposed on the laminated board 20.

As shown in FIG. 3, the laminated board 20 has a first surface 20a and a second surface 20b opposite to the first surface 20a. Furthermore, the laminated board 30 includes a ground layer 21 and a power layer 22.

It should be noted that in the present disclosure, in all of the cross-sectional views of the circuit board 2, only the ground layer 21 and the power layer 22 are illustrated, and the other layers of the laminated board 2 are omitted. In practice, the laminated board 20 is formed by stacking a plurality of insulating layers and a plurality of conductive layers, one of the conductive layers can serve as the ground layer 21, and another one of the conductive layers can serve as the power layer 22. The ground layer 21 and the power layer 22 can be insulated from each other by an insulating layer disposed therebetween.

As shown in FIG. 2, the pad array 200 is disposed on the laminated board 20. In the instant embodiment, the control device 1 can be assembled on the first surface 20a of the laminated board 20. Accordingly, the pad array 200 is located at the first surface 20a of the laminated board 20.

The pad array 200 includes a plurality of power pads P2 and a plurality of ground pads G2. The power pads P2 can respectively correspond to the power balls P1 of the ball grid array 10 shown in FIG. 1, and the ground pads G2 can respectively correspond to the ground balls G1 shown in FIG. 1.

In the instant embodiment, the ground pads G2 and the power pads P2 are jointly arranged in a first predetermined region 200R of the first surface 20a. Similar to the ball grid array 10 of the control device 1 shown in FIG. 1, the pad array 200 includes a plurality of power pads P2 which are electrically connected to the power layer 22, and a plurality of ground pads G2 which are electrically connected to the ground layer 21.

To be more specific, in the instant embodiment, the power pads P2 and the ground pads G2 are jointly arranged in a plurality of columns in the first direction D1. The power pads P2 and the ground pads G2 in each column are arranged in an alternating manner. Furthermore, in the pad array 200, the power pads P2 can be divided into a plurality of power pad groups 202, and the ground pads G2 can be divided into a plurality of ground pad groups 201.

Reference is made to FIG. 2 in conjunction with FIG. 3. At least one ground pad group 201 includes two ground pads G2 and is adjacent to one of the power pad groups 202, and a pad pitch d1' between the two ground pads G2 of the at least one ground pad group 201 is greater than a pad pitch d2' between the power pad P2 and the ground pad G2 which are adjacent to each other.

In order to correspond to the ball grid array 10, at least one power pad group 202 includes two power pads P2, and a pad pitch d1' between the two power pads P2 is greater than a pad pitch d2' between any one of the power pads P2 and the ground pad G2 adjacent thereto.

As shown in FIG. 2, the power pad groups 202 and the ground pad groups 201 are arranged in the first direction in an alternating manner. That is to say, in the first direction D1, one of the ground pad groups 201 is disposed between every two of the power pad groups 202. Furthermore, the power pad groups 202 and the ground pad groups 201 are also arranged in alternating manner in the second direction D2.

As shown in FIG. 3, the circuit board 2 of the embodiment in the present disclosure further includes a conductive via array. The conductive via array includes a plurality of ground conductive vias C21 and a plurality of power conductive vias C22. Each of the ground conductive vias C21 and the power conductive vias C22 passes through the laminated board 20. Each of the power pads P2 is electrically connected to the corresponding power conductive via C22, and each of the ground pads G2 is electrically connected to the corresponding ground conductive via C21.

Specifically, the pad pitch d1' between the two ground pads G2 of the at least one ground pad group 201 is wider so that a space for arranging one of the ground conductive vias C21 can be defined between the two ground pads G2. Accordingly, each of the ground conductive vias C21 can be disposed between the two ground pads G2 of the corresponding ground pad group 201. Similarly, each of the power conductive vias C22 can be disposed between the two power pads P2 of the corresponding power pad group 202.

In one embodiment, the pad pitch d1' between the two ground pads G2 of each ground pad group 201 (or between the two power pads P2 of each power pad group 202) ranges from 0.65 mm to 0.75 mm. Moreover, the pad pitch d2' between the power pad P2 and the ground pad G2, which are adjacent to each other, ranges from 0.4 mm to 0.5 mm.

It should be noted that since the pad pitch d2' between the power pad P2 and the adjacent ground pad G2 is narrower, no conductive via is disposed between the power pad P2 and the adjacent ground pad G2. Accordingly, the pad pitch d2' between the power pad P2 and the adjacent ground pad G2 can be reduced to less than 0.65 mm.

On the other hand, since the power pad groups 202 and the ground pad groups 201 are arranged in an alternating manner, the power conductive vias C22 and the ground conductive vias C21 are also arranged in alternating manner in the laminated board 20.

Accordingly, the power conductive vias C22 and the ground conductive vias C21 are alternately arranged so as to be in conjunction with the positions of the power pad groups 202 and the ground pad groups 201. Specifically, in the conductive via array, the power conductive vias C22 and the ground conductive vias C21 are alternately arranged in a plurality of columns in the first direction D1 and a plurality of rows in the second direction D2.

It should be noted that a transient current and a parasitic inductance that are generated during the operation of the control device 1 would result in simultaneous switching noise (SSN) in the circuit, thereby decreasing the supply voltage of the control device 1.

Furthermore, during the operation of the control device 1, the control device 1 may be switched from a low-power state to a high-power state within a few nanoseconds, which results in an increase of a current applied to the control device 1 within a very short period of time. The significant increase of the transient current variation magnifies the negative effects caused by the parasitic inductance. Accordingly, voltage drop of the power voltage may increase with the significant increase of the transient current variation and the existence of the parasitic inductance. As such, the power integrity would be reduced, thereby decreasing the operating stability of an electronic apparatus during the operation thereof.

In the present disclosure, the ground conductive vias C21 and the power conductive vias C22 are arranged in an alternating manner, such that an area defined by a current loop that is formed by the power pad P2, the power conductive via C22, the ground pad G2, and the ground conductive via C21 can be reduced, thereby decreasing parasitic inductance.

Since the parasitic inductance is decreased, a voltage drop that results from the parasitic inductance and a variation of transient current can be further reduced, so that the power integrity can be improved.

Reference is made to FIG. 2. The circuit board 2 further includes a wiring layer 23. The wiring layer 23 includes a plurality of front-side ground traces 231 and a plurality of front-side power traces 232.

The front-side ground traces 231 are disposed on the first surface 20a. Each of the front-side ground traces 231 is electrically connected to the corresponding ground pads G2 and the corresponding ground conductive vias C21. Specifically, in each of the ground pad groups 201, the two ground pads G2 are electrically connected to the ground conductive via C21 located therebetween by the corresponding one of the front-side ground traces 231.

Similarly, the front-side power traces 232 are disposed on the first surface 20a. Each of the front-side power traces 232 is electrically connected to the corresponding power pad P2 and the corresponding power conductive via C22. In each of the power pad groups 202, the two power pads P2 are electrically connected to the power conductive via C22 located therebetween by the corresponding one of the front-side power traces 232.

Figure 4:
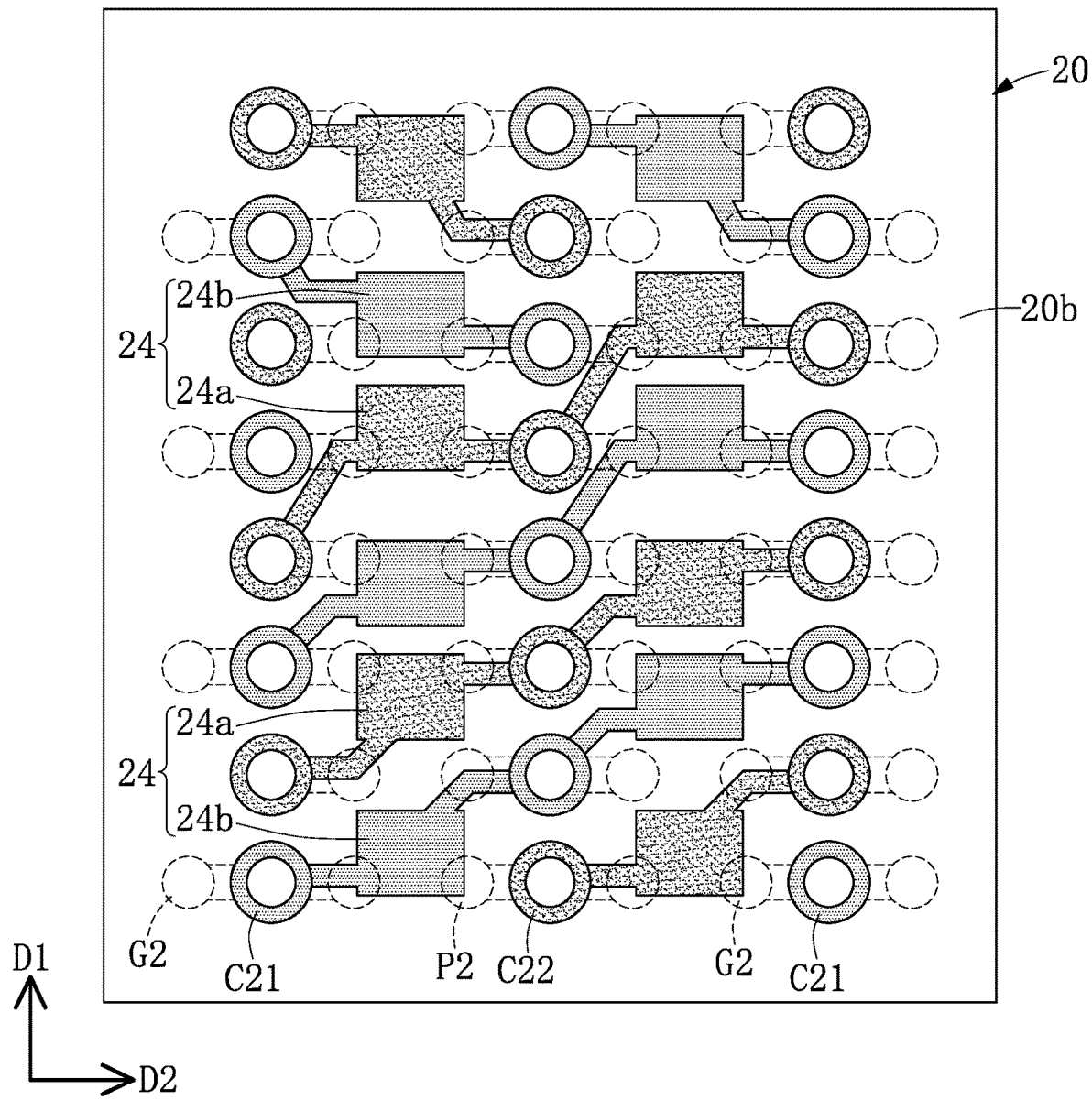
FIG. 4 is a partial view of the bottom of the circuit board of FIG. 2.

Reference is made to FIG. 3 and FIG. 4. FIG. 4 is a partial view of the bottom of the circuit board of FIG. 2. As shown in FIG. 4, the circuit board 2 of the present embodiment further includes a plurality of contact pad groups 24, and the contact pad groups 24 are disposed on the second surface 20b of the laminated board 20.

In the instant embodiment, each of the contact pad groups 24 includes an anode contact pad 24a and a cathode contact pad 24b for being electrically connected to a passive element. The passive element is such as a multilayer ceramic capacitor (MLCC).

In the instant embodiment, in the first direction D1, the anode contact pad 24a and the cathode contact pad 24b are arranged between the two adjacent rows of the conductive via array in the first direction M. For two adjacent contact pad groups 24, the anode contact pad 24a in one of the contact pad groups 24 is adjacent to the cathode contact pad 24b in the other one of the contact pad groups 24.

That is to say, for two adjacent contact pad groups 24, the anode contact pad 24a and the cathode contact pad 24b in one of the contact pad groups 24 are respectively arranged at positions opposite to the positions of anode contact pad 24a and the cathode contact pad 24b in the other contact pad group 24.

Moreover, as shown in FIG. 4, the circuit board 2 further includes a bottom-side wiring layer (not assigned with a reference numeral) disposed on the second surface 20b so that the anode contact pad 24a is electrically connected to the corresponding one of the power conductive vias C22, and the cathode contact pad 24b is electrically connected to the corresponding one of the ground conductive vias C21.

Reference is made to FIG. 4, the anode contact pad 24a and the cathode contact pad 24b in each of contact pad groups 24 are arranged at a corresponding region between the power pad group 202 and the ground pad group 201 which are adjacent to each other. That is to say, the anode contact pad 24a and the cathode contact pad 24b in each of contact pad groups 24 are arranged at a region that is not occupied by any of the ground conductive vias C21 and the power conductive vias C22. Accordingly, the number of the contact pad groups 24 can be adjusted according to the number of the passive element.

Furthermore, in the embodiment of the present disclosure, since the ground conductive vias C21 and the power conductive vias C22 are arranged in an alternating manner, the contact pad groups 24 can be scattered across the region on which neither the power conductive vias C22 nor the ground conductive vias C21 is disposed. When the passive elements are disposed on the circuit board 2, the passive elements are also scattered and disposed among the conductive via array so as to be electrically connected to more numbers of the ground conductive vias C21 and the power conductive vias C22, thereby effectively reducing the impedance during the high-frequency operation of the control device 1.

Accordingly, when the passive elements are disposed on the second surface 20b of the circuit board 2 respectively through the contact pad groups 24 corresponding thereto, the passive elements can be electrically connected in parallel to one another, thereby reducing the parasitic inductance.

Figure 5:
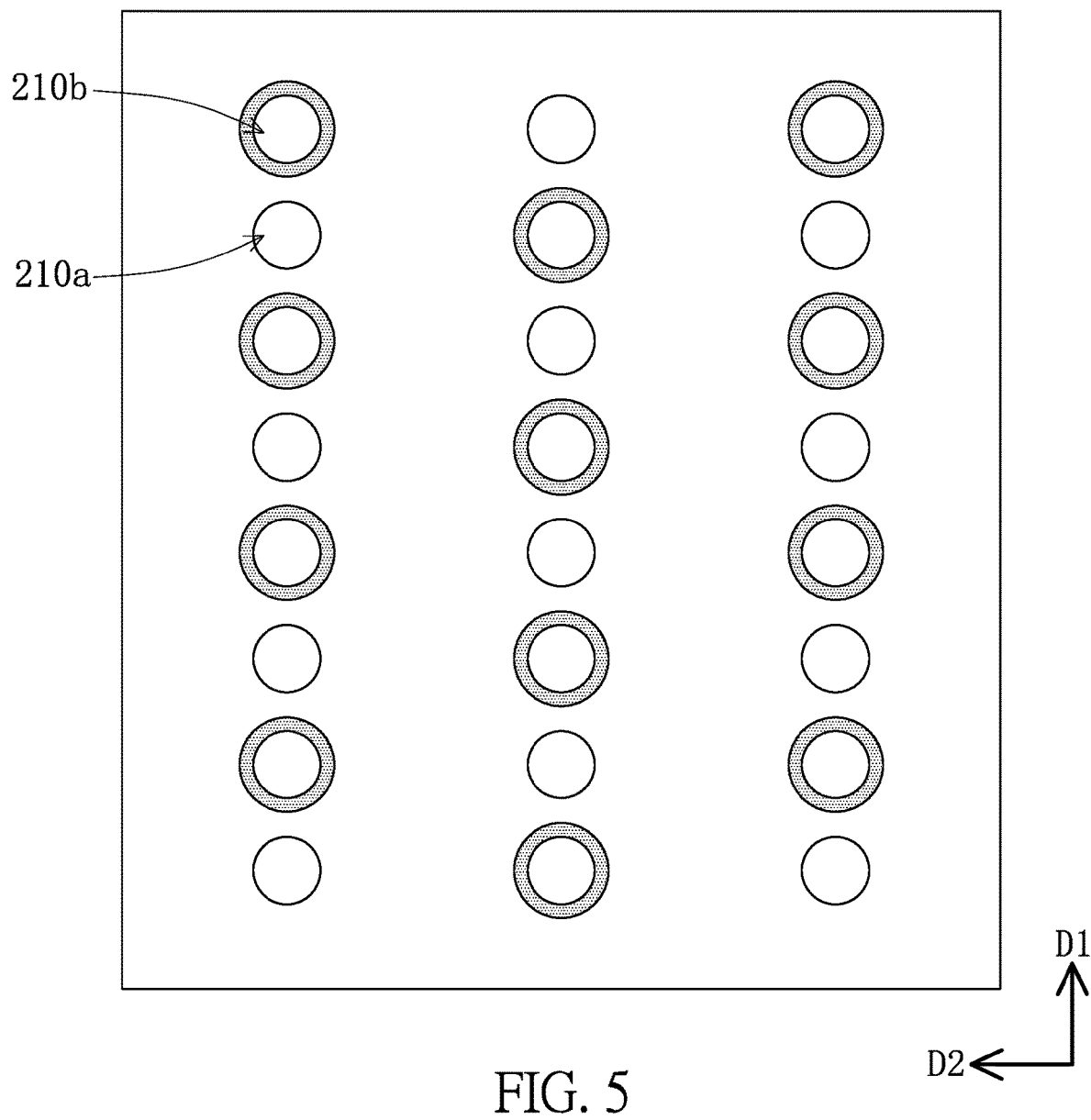
FIG. 5 is a partial top view of a ground layer according to an embodiment of the present disclosure.

Reference is made to FIG. 3 in conjunction with FIG. 5, in which FIG. 5 is a partial top view of a ground layer according to an embodiment of the present disclosure.

As shown in FIG. 5, the ground layer 21 has a plurality of first conductive holes 210a so that the ground layer 21 can be electrically connected to the ground conductive vias C21. In other words, each of the ground conductive vias C21 can be electrically connected to the ground layer 21 through the corresponding first conductive hole 210a.

Furthermore, the ground layer 21 further has a plurality of first insulating holes 210b so that the ground layer 21 can be insulated from the power conductive vias C22 passing through the laminated board 20. The first insulating holes 210b are arranged at positions respectively corresponding to the positions of the power conductive vias C22. As such, each of the power conductive vias C22 can be insulated from the ground layer 21 by the corresponding one of the first insulating holes 210b.

As shown in FIG. 5, a first pattern that is jointly formed by the first insulating holes 210b on the surface of the ground layer 21 is the same as a power pattern that is jointly formed by the power conductive vias C22 on the first surface 20a.

Figure 6:
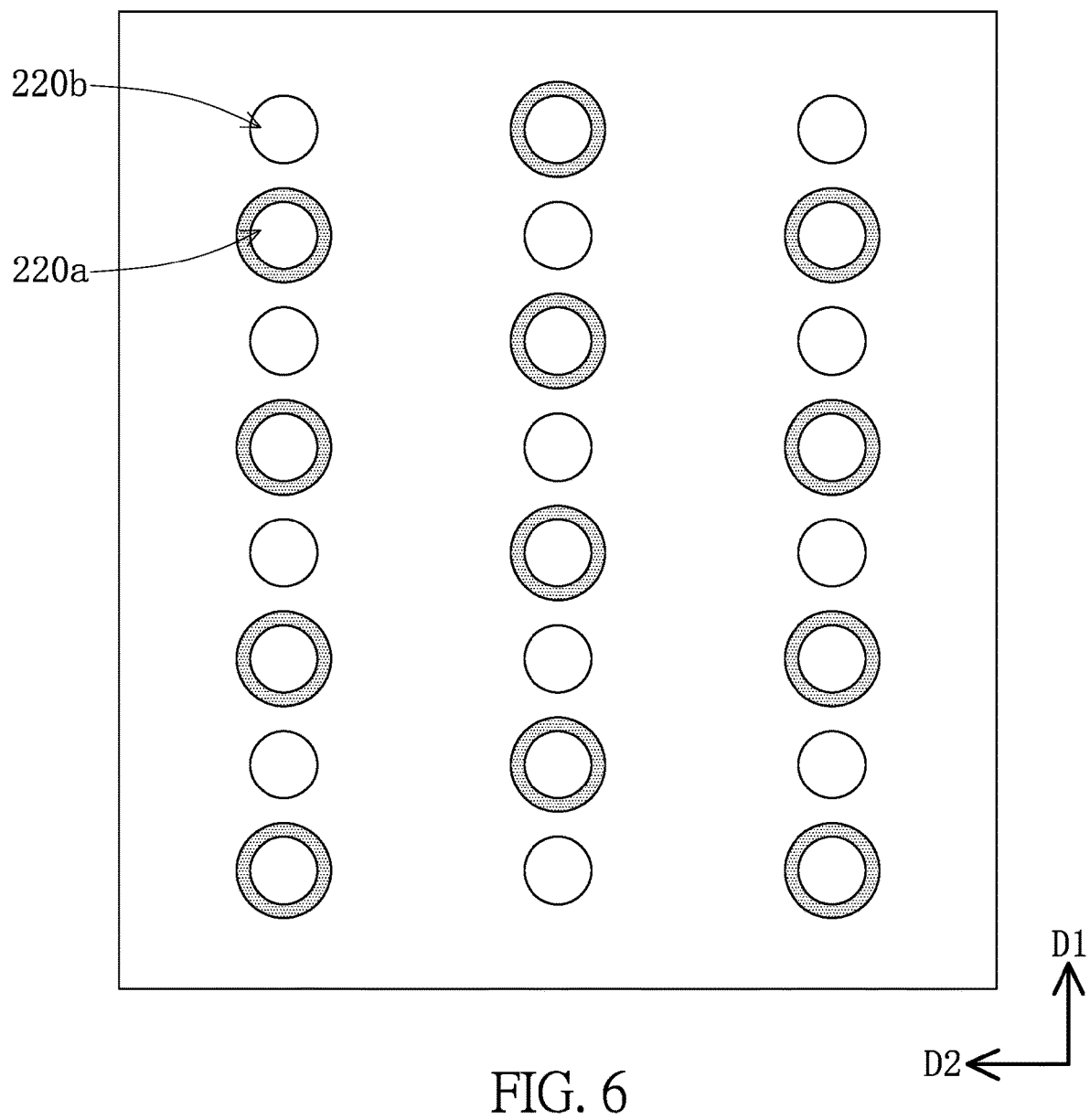
FIG. 6 is a partial top view of a power layer according to an embodiment of the present disclosure.

Similarly, reference is made to FIG. 3 in conjunction with FIG. 6, in which FIG. 6 is a partial top view of a power layer according to an embodiment of the present disclosure.

As shown in FIG. 3 the ground conductive vias C21 pass through the laminated board 20. Accordingly, in order to insulate the power layer 22 from the ground conductive vias C21 and electrically connect the power layer 22 to the power conductive vias C22, the power layer 22 further has a plurality of second insulating holes 220a and a plurality of second conductive holes 220b formed therein.

The second insulating holes 220a are arranged at the positions respectively corresponding to the positions of the ground conductive vias C21. That is to say, each of the ground conductive vias C21 can be insulated from the power layer 22 by the corresponding one of the second insulating holes 220a.

The second conductive holes 220b are arranged at positions respectively corresponding to the positions of the power conductive vias C22, so that each of the power conductive vias C22 can be electrically connected to the power layer 22 by the corresponding one of the second conductive holes 220b.

As shown in FIG. 6, the second insulating holes 220a jointly form a second pattern on the surface of the power layer 22, and the second pattern is the same as a ground pattern that is formed by the ground conductive vias C21 on the first surface 20a.

Figure 7:
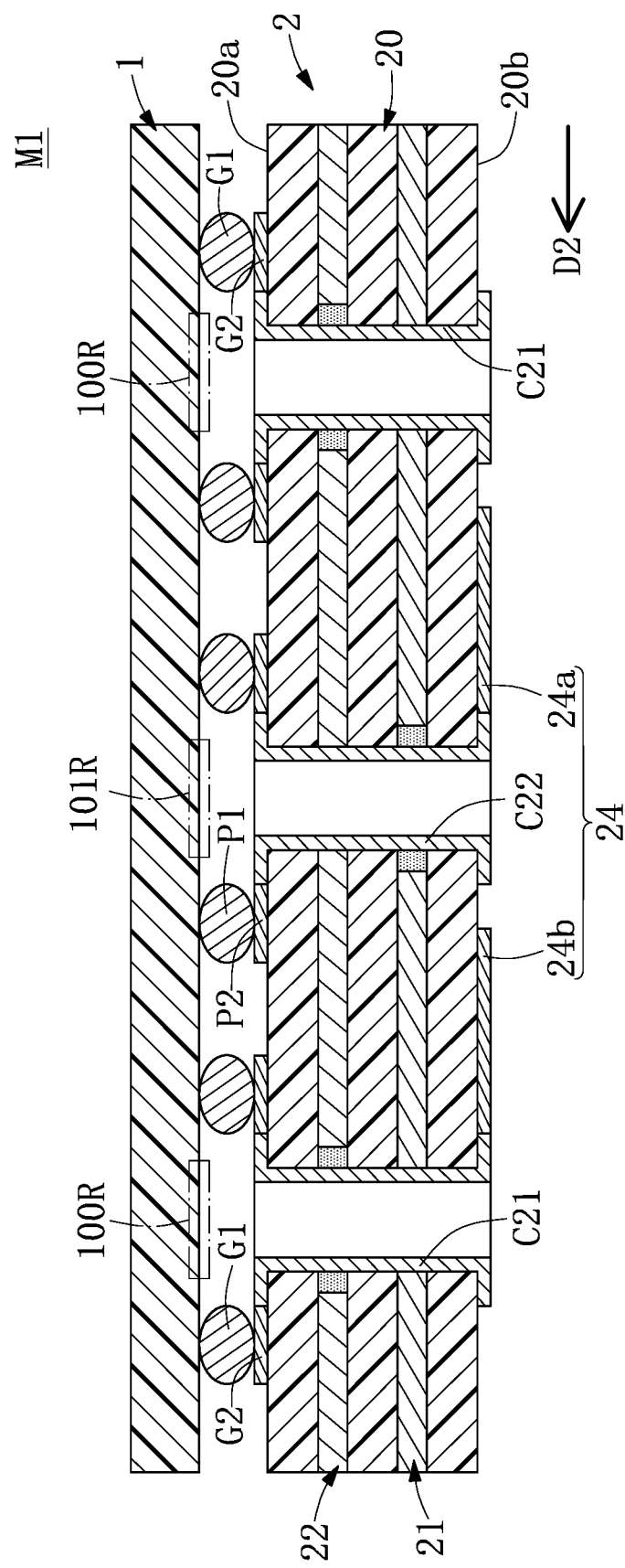
FIG. 7 is a partial sectional view of the control device assembled on the circuit board according to an embodiment of the present disclosure.

Reference is made to FIG. 7, which is a partial sectional view of the control device assembled on the circuit board according to an embodiment of the present disclosure. When the control device 1 is assembled on the circuit board 2, the power ball groups 101 of the control device 1 respectively correspond to the power pad groups 202 of the circuit board 2. Furthermore, the ground ball groups 100 of the control device 1 respectively correspond to the ground pad groups 201 of the circuit board 2, and respectively correspond to the ground conductive vias C21.

Specifically, the two ground balls G1 in each of the ground ball groups 100 are respectively in alignment with the two ground pads G2 in the corresponding one of the ground pad groups 201. Furthermore, since the ball pitch d1 between the two adjacent ground balls G1 is relatively wider, the first corresponding region 100R defined between the two adjacent ground balls G1 is in alignment with one of the ground conductive vias C21.

Similarly, the two power balls P1 in each of the power ball groups 101 are respectively in alignment with the two power pads P2 in the corresponding one of the power pad groups 202. Furthermore, the second corresponding region 101R defined between the two adjacent power balls P2 can correspond to one of the power conductive vias C22. On the other hand, since the ball pitch d2 between the ground ball G1 and the power ball P1 which are adjacent to each other is relatively narrower, the region located between the ground ball G1 and the power ball P1 which are adjacent to each other is not in alignment with any one conductive via.

In conclusion, one of the advantages of the present disclosure is that in the control device and the circuit board provided in the present disclosure, by the technical features of "a ball pitch d1 between the two ground balls G1 of the at least one of the ground ball groups 100 is greater than the ball pitch d2 between the power ball P1 and the ground ball G1 which are adjacent to each other" or "the ground balls G1 and the power balls P1 are alternately arranged to form a first column, a second column, and a third column, all of which extend in a first direction D1, and a first column pitch between the first and second columns is greater than a second column pitch between the second and third columns," the size of the control device 1 can be further reduced without overly reducing the space for disposing the ground conductive vias C21 and the power conductive vias C22 in the circuit board 2.

As such, even though the size of the control device 1 is reduced, significant increases of the impedance and the fabrication cost can be avoided. That is to say, the size of the control device 1 can be reduced by arranging the ball grid array with different ball pitches, with the ball pitch d1 between any two adjacent ground balls G1 (or two adjacent power balls P1), and the ball pitch d2 between any ground ball G1 and the power ball P1 adjacent thereto. In one embodiment, the control device 1 in the present disclosure is about 0.7 times the size (225 mm$^2$) of the conventional integrated circuit device package.

Furthermore, the arrangement of the pad array 200 of the circuit board 2 corresponds to the arrangement of the ball grid array 10 of the control device 1, such that the power conductive vias C22 and the ground conductive vias C21 can be alternately arranged. As such, the parasitic inductance generated in the circuit board 2 can be reduced, thereby avoiding too large a voltage variation resulting from the significant increase of the transient current variation when the control device operates in high frequency.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A control device comprising a ball grid array disposed at a bottom thereof, wherein the ball grid array includes a plurality of ground balls and a plurality of power balls, which are jointly arranged in a ball region, the power balls being divided into a plurality of power ball groups, and the ground balls being divided into a plurality of ground ball groups;
   wherein at least one of the ground ball groups includes two of the ground balls and is adjacent to at least one of the power ball groups, a ball pitch between the two ground balls of the at least one of the ground ball groups is greater than that between one of the power balls and one of the ground balls that are adjacent to each other; and
   wherein the ground balls and the power balls are alternately arranged to form a first column, a second column, and a third column, all of which extend in a first direction, and a first column pitch between the first and second columns is greater than a second column pitch between the second and third columns.

2. The control device according to claim 1, wherein the at least one of the ground ball groups further includes a first corresponding region defined between the two ground balls, and an imaginary connection line connecting between two centers of the two ground balls extends across the first corresponding region.

3. The control device according to claim 1, wherein at least one of the power ball groups includes two of the power balls and a second corresponding region defined therebetween, and a ball pitch between the two power balls is greater than that between one of the power balls and one of the ground balls that are adjacent to each other.

4. The control device according to claim 1, wherein the power ball groups and the ground ball groups are alternately arranged in the first direction, and one of the ground ball groups is arranged between every two power ball groups.

5. The control device according to claim 1, wherein the power balls and the ground balls are arranged into a plurality of rows in a second direction, and a row pitch between any two adjacent rows is less than the first column pitch.

6. An electronic apparatus, comprising:
   the control device including a ball grid array disposed at a bottom thereof, wherein the ball grid array includes a plurality of ground balls and a plurality of power balls, which are jointly arranged in a ball region, the power balls being divided into a plurality of power ball groups, and the ground balls being divided into a plurality of ground ball groups; and wherein at least one of the ground ball groups includes two of the ground balls and is adjacent to at least one of the power ball groups, a ball pitch between the two ground balls of the at least one of the ground ball groups is greater than that between one of the power balls and one of the ground balls that are adjacent to each other; and
   a circuit board, wherein the control device is disposed on the circuit board, and the circuit board includes:
      a laminated board having a first surface and a second surface opposite the first surface, wherein the laminated board includes a ground layer and a power layer which is insulated from the ground layer; and
      a pad array disposed on the first surface, wherein the pad array includes a plurality of power pads which are electrically connected to the power layer and the power balls of the control device, respectively, and a plurality of ground pads which are electrically connected to the ground layer and the ground balls of the control device, respectively;
   wherein the power pads and the ground pads are jointly arranged in a first predetermined region of the first surface, the power pads are divided into a plurality of power pad groups, and the ground pads are divided into a plurality of ground pad groups; and
   wherein at least one of the ground pad groups includes two ground pads and is adjacent to one of the power pad groups, and a pad pitch between the two ground pads of the at least one of the ground pad groups is greater than a pad pitch between one of the power pads and one of the ground pads that are adjacent to each other.

7. The electronic apparatus according to claim 6, wherein the ground balls and the power balls are alternately arranged to form a first column, a second column, and a third column, all of which extend in a first direction, and a first column pitch between the first and second columns is greater than a second column pitch between the second and third columns.

* * * * *